United States Patent
Tseng et al.

[11] Patent Number: 6,161,575
[45] Date of Patent: Dec. 19, 2000

[54] APPARATUS AND METHOD FOR PREVENTING CHAMBER CONTAMINATION

[75] Inventors: Heing Yi Tseng; Mason Juang, both of Hsin-chu, Taiwan

[73] Assignee: Taiwan Semiconductor Manufacturing Company, Ltd, Hsin Chu, Taiwan

[21] Appl. No.: 09/141,947

[22] Filed: Aug. 28, 1998

[51] Int. Cl.[7] .................................................. C25C 16/00
[52] U.S. Cl. .................... 137/546; 137/565.01; 137/613; 137/571; 251/326; 118/715
[58] Field of Search .............................. 137/546, 565.01, 137/571, 613; 251/326; 118/715

[56] References Cited

U.S. PATENT DOCUMENTS

| | | | |
|---|---|---|---|
| 21,765 | 10/1858 | Mallerd | 137/546 |
| 1,177,621 | 4/1916 | Hauk | 137/571 |
| 4,406,304 | 9/1983 | Vamvakas | 137/546 |
| 4,655,800 | 4/1987 | Tsukada et al. | 96/136 |
| 5,904,757 | 5/1999 | Hayashi et al. | 55/423 |
| 6,015,463 | 1/2000 | Cox | 118/715 |

*Primary Examiner*—A. Michael Chambers
*Attorney, Agent, or Firm*—Tung & Associates

[57] ABSTRACT

An apparatus and a method for providing fluid communication between a process chamber and a dry pump without contamination problem are disclosed. The apparatus utilizes a conduit that has at least one gate valve installed therein for opening or closing the conduit and a T-shaped cold trap to collect large size contaminating particles. The present invention apparatus is effective in preventing particle contamination to the process chamber by a siphoning or backsteam effect when a dry pump failure occurs. While the present invention apparatus and method may be used in any deposition process which produces reaction by-products, or contaminating particles, it is particularly suitable for use in a TEOS oxide deposition process.

20 Claims, 2 Drawing Sheets

SV - Solenoid Valve
Timer setting: 15 mins

APPARATUS AND METHOD FOR PREVENTING CHAMBER CONTAMINATION

FIELD OF THE INVENTION

The present invention generally relates to an apparatus and a method for preventing contamination to a semiconductor process chamber and more particularly, relates to an apparatus and a method for preventing contamination by a reaction by-product to a chemical vapor deposition chamber in a TEOS oxide deposition process by utilizing an additional gate valve positioned juxtaposed to a dry pump and a T-shaped cold trap for collecting contaminating particles.

BACKGROUND OF THE INVENTION

Chemical vapor deposition (CVD) method has been used in the deposition of silicon dioxide films onto semiconducting substrates. In the method, a gas containing the structural elements of the film material to be formed is fed into a chamber, followed by heating the gas to induce a chemical reaction to deposit the desired film on the semiconducting substrate. In a conventional CVD method, a silicon dioxide film is frequently deposited by a reaction between silane and oxygen. The method enables the formation of a silicon dioxide film at a relatively low temperature.

In the fabrication of an advanced semiconductor device that requires a steep step coverage by a silicon dioxide film, the conventional CVD method of deposition by sitane and other reactant gases was found to be inadequate, i.e., presenting a step coverage problem. In order to solve the step coverage problem, other methods have been developed. One of such methods is the utilization of a reactant of tetra-ethoxy-ortho-silicate (TEOS) which has better coverage characteristics than silane, although TEOS must be processed at a high reaction temperature due to its low reactivity.

In the high temperature processing of TEOS, the pyrolysis of TEOS for obtaining an oxide film is similar to the decomposition process of silane in forming polysilicon. A carrier gas, typically an inert gas such as nitrogen, can be used to bubble through liquid TEOS to provide a gas mixture of controlled TEOS partial pressure in the reaction chamber. Since TEOS consists of a silicon atom that is symmetrically bonded to four $OC_2H_5$ groups, the decomposition of TEOS at a high temperature, i.e., between 650° C. and 750° C. results in silicon dioxide and by-products of organic and organosilicon compounds. For instance, the pyrolysis reaction of TEOS can be represented by:

$Si(C_2H_5O)_4 \rightarrow SiO_2 + \text{by-products}$

The deposition rate of $SiO_2$ depends on the TEOS partial pressure presented in the reaction chamber and the reaction temperature. Oxide films may also be produced by reacting TEOS with oxygen at low pressure and high temperature, i.e., between 650~750° C. The reaction produces $SiO_2$, $CO_2$ and $H_2O$. The TEOS oxide films produced by the LPCVD method exhibit excellent uniformity and step coverage. However, the high decomposition temperature of TEOS precludes its usage for depositing oxide layers over pre-formed structures that are high temperature sensitive, such as structures formed of aluminum or metal suicides.

In a low pressure TEOS oxide deposition process, the deposition chamber or the chemical vapor deposition chamber must first be evacuated to a very low pressure. For instance, the low pressure between about 1 Pa and about 120 Pa. The evacuation of the chemical vapor deposition chamber is carried out by an electrical dry pump. The conduit that connects between the process chamber and the dry pump and provides fluid communication therein between is controlled by a gate valve for opening or closing the conduit. The gate valve is positioned at a location juxtaposed or neighboring to the process chamber. In such a conventional set up, the conduit, which is frequently a 4-inch diameter stainless steel pipe, is frequently coated with a layer of reaction by-product on its inner wall. The reaction by-product is formed of hydrocarbon chemistry and exists in a white powdery form. Its exact composition varies and is difficult to determine by routine chemical analysis.

The dry pump used to evacuate the deposition chamber is frequently mounted at Et floor level substantially below that of the process chamber and operates at the atmospheric pressure. The length of the conduit that connects the process chamber and the dry pump may be as long as 10~15 meters which presents ample opportunity for the reaction by-product to deposit on the inner wall when evacuated by the pump. The by-product also cumulates in the dry pump chamber and may even cause the pump to stop functioning due to jamming of the rotors. When jamming occur, the dry pump stops completely. When the pump stops, the powdery deposit on the interior wall of the conduit and in the dry pump may be siphoned back into the process chamber due to a large pressure differential existed between the dry pump and the process chamber, i.e., at $10^5$ Pa vs. at $10^2$ Pa. Even though a gate valve is provided in the conduit and is suppose to stop the siphoning or the backsteam (as commonly known in a fabrication plant), the gate valve itself may be contaminated by the by-product and thus fails to function properly to stop the siphoning of powder into the chamber. Since a large number of wafers are processed in a modern furnace, i.e., as many as 144 wafers can be processed in a vertical furnace, particle contamination in the furnace can be detrimental to the yield of the fabrication process. The contamination to a process chamber by such by-product must therefore be prevented.

It is therefore an object of the present invention to provide an apparatus for a process chamber that does not have the drawbacks or shortcomings of the conventional apparatus.

It is another object of the present invention to provide an apparatus for evacuating a process chamber that utilizes a gate valve and a T-shaped cold trap in a conduit connecting the process chamber and the dry pump.

It is a further object of the present invention to provide an apparatus for evacuating a process chamber wherein a gate valve is installed in a conduit providing fluid communication between process chamber and a dry pump at a location juxtaposed to the process chamber.

It is another further object of the present invention to provide an apparatus for evacuating a process chamber wherein a gate valve and a T-shaped cold trap are installed in a conduit connecting between a process chamber and a dry pump wherein the cold trap is capable of collecting large-size contaminating particles.

It is still another object of the present invention to provide an apparatus for establishing fluid communication between a process chamber and a dry pump wherein a first gate valve, a T-shaped cold trap and a second gate valve are provided sequentially between the process chamber and the dry pump.

It is yet another object of the present invention to provide an apparatus for establishing fluid communication between a process chamber and a dry pump wherein a first gate valve is installed in a conduit positioned in close proximity to the process chamber, a second gate valve is positioned in close proximity to the dry pump and a T-shaped cold trap is connected between the first gate valve and the second gate valve.

It is still another further object of the present invention to provide a method for preventing chamber contamination by particles from a conduit or a pump by installing a first gate valve in the conduit immediately adjacent to the process chamber, a second gate valve in the conduit immediately adjacent to the dry pump and a T-shaped cold trap between the first gate valve and the second gate valve.

It is yet another further object of the present invention to provide a method for preventing chamber contamination by particles from a conduit or a pump by installing a third valve by-passing the second gate valve which has a smaller passage therethrough to avoid overloading of the pump at the start of a pumping sequence.

SUMMARY OF THE INVENTION

In accordance with the present invention, an apparatus for evacuating a process chamber by a dry pump and a method for utilizing such apparatus are provided.

In a preferred embodiment, an apparatus for evacuating a process chamber by a dry pump is provided which includes a conduit providing fluid communication between the process to chamber and the dry pump, a gate valve for opening and closing the conduit situated juxtaposed to the process chamber, and a T-shaped particle trap in fluid communication with the gate valve and the dry pump for collecting particles in the conduit.

The T-shaped particle trap used in the apparatus may be a cold trap. The apparatus may further include a second gate valve for opening and closing the conduit situated juxtaposed to the dry pump. The first gate valve may be situated immediately adjacent to the process chamber.

A first pressure in the process chamber is about $1.2 \times 10^2$ Pa and a second pressure in the dry pump is about $10^5$ Pa. The apparatus may further include a second T-shaped particle trap connected in series with the T-shaped particle trap. The T-shaped particle trap substantially prevents particle contamination to the process chamber by reducing numbers of particles deposited in the conduit. The gate valve and the T-shaped particle trap further prevent particle contamination to the process chamber upon failure of the dry pump.

In another preferred embodiment, an apparatus for providing fluid communication between a process chamber and a dry pump is provided which includes a conduit member connecting the process chamber and the dry pump for providing fluid communication therein between, a first gate valve in the conduit positioned juxtaposed to the process chamber, a T-shaped cold trap situated in between and in fluid communication with the first gate valve and a second gate valve, and a second gate valve in the conduit positioned juxtaposed to the dry pump.

The first gate valve may be positioned in close proximity to the process chamber while the second gate valve may be positioned in close proximity to the dry pump. The apparatus may further include a pneumatic valve for by-passing the second gate valve. The pneumatic valve may have a fluid passage substantially smaller than a passage in the conduit member for preventing overloading of the dry pump at the beginning of a pumping sequence. The apparatus may further include a second T-shaped cold trap connected in series with the T-shaped cold trap. A first pressure in the process chamber may not be higher than $1.2 \times 10^2$ Pa and a second pressure in the dry pump may be about $10^5$ Pa. The first gate valve, the T-shaped cold trap and the second gate valve substantially prevent particle contamination to the process chamber upon failure of the dry pump.

The present invention is further directed to a method for preventing chamber contamination by particles from a conduit or a pump by the operating steps of first providing a conduit for fluid communication between a process chamber and a pump, then installing a first gate valve in the conduit juxtaposed to the process chamber, installing a T-shaped cold trap in the conduit in between the gate valve and the pump, whereby the first gate valve and the T-shaped cold trap substantially prevents particle contamination to the process chamber upon failure of the pump.

The method may further include the step of installing a second gate valve in the conduit juxtaposed to the pump. The method may further include the step of installing a second gate valve in the conduit immediately adjacent to the pump. The first gate valve may be installed in the conduit in close proximity to the process chamber. The method may further include the step of installing a pneumatic valve bypassing the second gate valve wherein the pneumatic valve has a fluid passage substantially smaller than a passage in the conduit. The method may further include the steps of bypassing the second gate valve with a third valve which has a smaller passage than a passage in the second gate valve, and evacuating the process chamber through the third valve for preventing overloading of the pump at the start of an evacuation sequence.

BRIEF DESCRIPTION OF THE DRAWINGS

The objects, features and advantages of the present invention will become apparent from the following detailed description and the appended drawings in which.

DETAILED DESCRIPTION OF THE PREFERRED AND ALTERNATE EMBODIMENT

Figure 1:
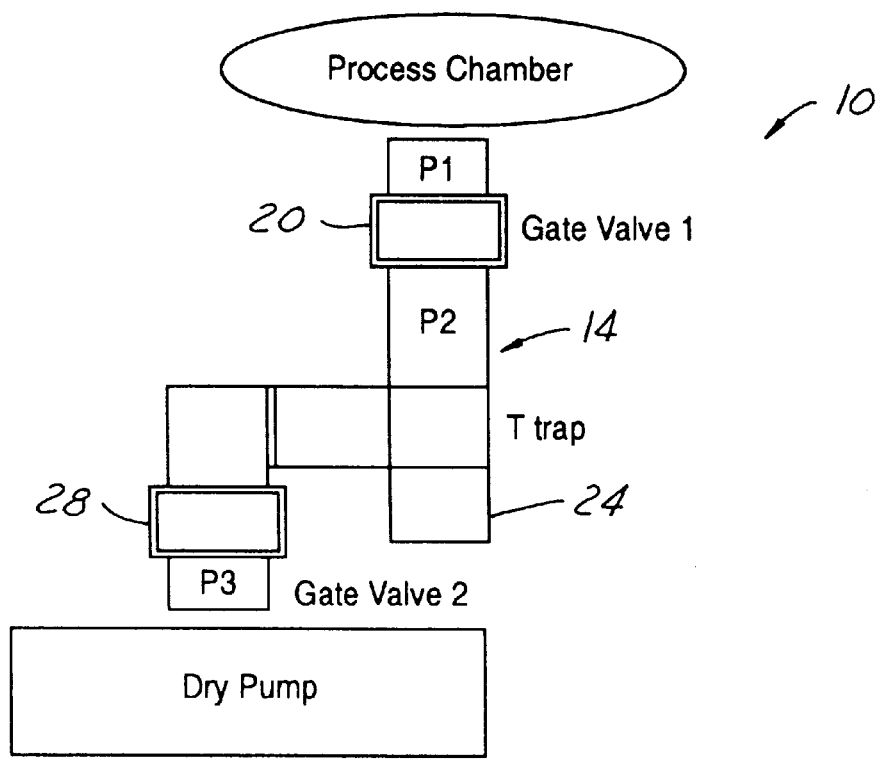
FIG. 1 is simplified graph illustrating the present invention apparatus having two gate valves and a T-trap installed in a conduit connecting a process chamber and a dry pump.

The present invention provides an apparatus and a method for venting a process chamber by a dry pump wherein a conduit providing fluid communication between the process chamber and the dry pump is equipped with at least one gate valve for opening and closing the conduit which is situated juxtaposed to the process chamber, and a T-shaped particle trap connected in between the gate valve and the dry pump for collecting particles in the conduit that are at least of 100 $\mu$m diameter size.

The present invention novel apparatus effectively prevents a siphoning, or backsteam of contaminating particles generated as by-products in a TEOS oxide process from flowing back into the process chamber and contaminating the wafers in the chamber. The T-shaped cold trap effectively collects larger contaminating particles, i.e., those particles having a diameter larger than 100 $\mu$m (or 0.1 mm), i.e., the particles held by the cold trap is approximately the size of a grain of rice. It was discovered that other contaminating particles of smaller sizes do not impede the proper operation of a dry pump. It was also discovered that larger particles, those of 100 μm or larger, do not overcome gravitational force once they have been collected at the bottom of the T-shaped cold trap. By utilizing the present invention novel apparatus and method, the amount of the TEOS by-product during a monthly preventive maintenance procedure, collected in a cold trap is approximately 300 gm.

It is generally desirable that the line for a pump should be as straight as possible in order to avoid a drop in the pumping speed. The T-shaped cold trap utilized in the present invention only affects the pumping speed slightly and thus does not present a problem.

The present invention novel apparatus, as presented in an alternate embodiment, utilizes a second gate valve for controlling the passage between a process chamber and a dry pump. It was discovered that a single gate valve, without a T-shaped cold trap, cannot effectively prevent backstream (or siphoning) of contaminating powder when pump failure occurs. This is because a single gate valve may be coated or contaminated by a powdery coating of the by-product and therefore can no longer seal perfectly. The backstream, and the resulting contamination of wafers by the reaction by-product, must therefore be prevented from occurring in order to avoid serious contamination problem.

In the present invention alternate embodiment, a second gate valve is installed, in combination with a T-shaped cold trap, at a location close to the dry pump while the first gate valve is installed close to the process chamber. The second gate valve does not have a sealing problem since the T-shaped cold trap effectively decreases the powdery by-product from reaching the second gate valve. When the present invention alternate embodiment is implemented, any contaminating particles left in the pump have to go through the second gate valve, the T-trap, the long conduit line and the first gate valve in order to reach the process chamber. The contamination of the chamber is therefore very unlikely which further contributes to the effectiveness of the present invention novel method. It has been observed, with the present invention alternate embodiment in place, the contaminating particle count is drastically reduced from 1500 to 100 for 0.15 mm sized particles. This is a 15-fold decrease which clearly demonstrates the effectiveness of the present invention method.

Referring initially to FIG. 1, wherein a simplified illustration of the present invention apparatus 10 is shown. The apparatus 10 consists of a process chamber 12 which is a low pressure chemical vapor deposition chamber for depositing TEOS oxide films. The process chamber 12 is connected to and is in fluid communication with a dry pump 16 through conduit 14. The conduit 14 is normally constructed of a four inch diameter stainless steel pipe. The conduit 14, as shown in FIG. 1, is controlled by a first gate valve 20 situated at a position juxtaposed, or in close proximity to the process chamber 12. By in close proximity, it is meant that the distance is between about 5 cm and about 100 cm. The conduit 14 is then connected to a T-shaped cold trap 24 as shown in FIG. 1. A more detailed illustration of the T-trap will be given in a later section.

The gas evacuated from the process chamber 12, after depositing large contaminating particles in the T-trap 24, continuously flows through second gate valve 28 into dry pump 16. It should be noted that the second gate valve 28 is shown only in the alternate embodiment and is not absolutely necessary for the successful implementation of the present invention method. The second gate valve 28 when utilized, should be installed juxtaposed to, or in close proximity to the dry pump 16. By in close proximity, it is meant that the second gate valve 28 should be installed at a distance to the dry pump 16 between about 5 cm and about 100 cm. It should be noted that the components shown in FIG. 1, and their relative positions are simplified to merely indicate a concept of the present invention apparatus. The scope of the present invention method is therefore not limited by such illustration.

Figure 2:
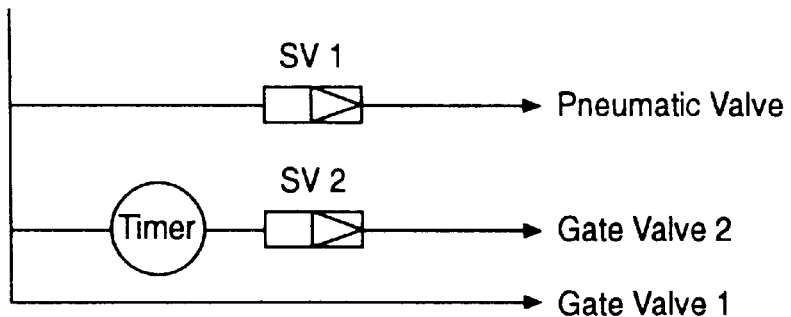
FIG. 2 is an illustration of a timing sequence for the pneumatic valve, the first gate valve and the second gate valve.

A timing sequence chart for the operation of the gate valves and the optional pneumatic valve (shown in FIG. 3) is illustrated in FIG. 2. In order to slow start a pumping sequence, the second gate valve 28 may be first shut off and by-passed by opening a pneumatic valve 30 (shown in FIG. 3). The pneumatic valve 30 is used to by-pass the second gate valve 28 utilizing a conduit of only ⅜ inch diameter and thus allowing a much smaller flow of gases through the conduit. This greatly reduces an initial load on the dry pump and avoids a possible overloading of the pump at the start of a pumping cycle. The pneumatic valve 30 is opened for a short time period, i.e., between about 5 minutes and about 20 minutes, to achieve a positive pressure before the pneumatic valve 30 is turned off and the second gate valve 28 is turned on. The gate valves 20, 28 and the pneumatic valve 30 are typically controlled by solenoid valves.

Figure 3:
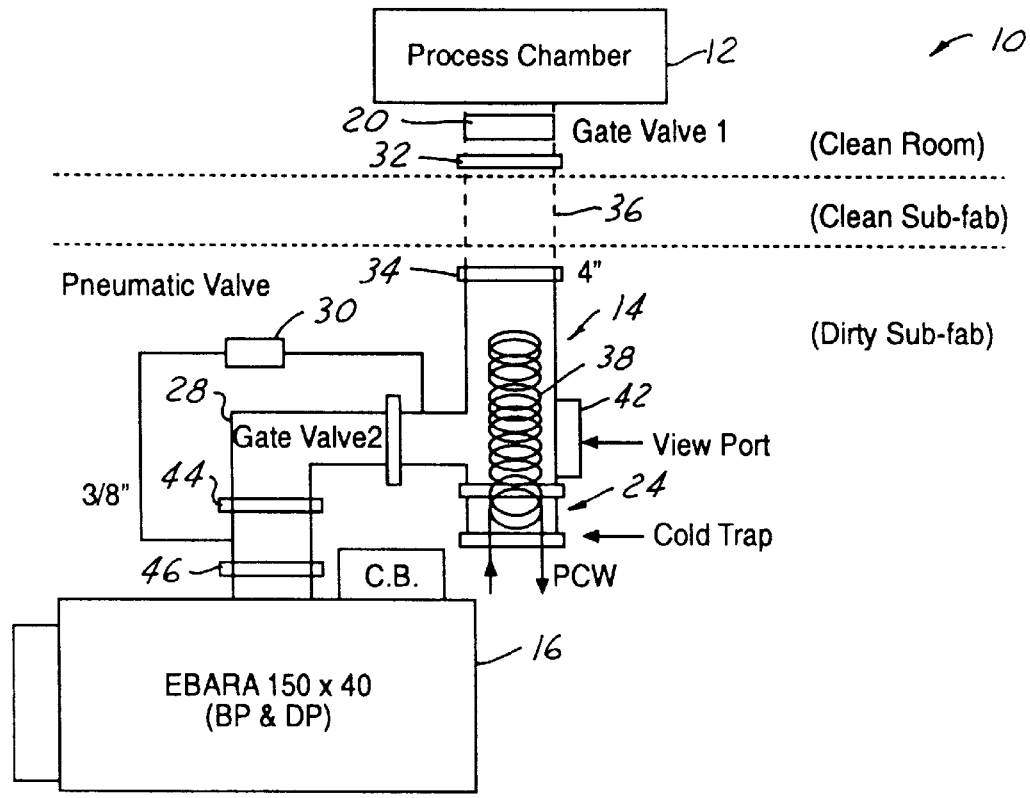
FIG. 3 is an illustration of the present invention apparatus showing the relative positions of the various components.

A detailed illustration of the present invention apparatus 10 is shown in FIG. 3. The first gate valve 20 is connected in close proximity to the process chamber 12 in conduit 14. The process chamber 12 and the first gate valve 20 are normally positioned in a clean room atmosphere. A fluid communication is established with process chamber 12 by stainless steel conduit 24 through flange connectors 32 and 34. A middle section of the conduit 36 goes through a clean sub-fab environment, while the end of the conduit 14 connects to dry pump 16 situated in a dirty sub-fab environment. This is shown in FIG. 3. A condenser coil 38 is utilized in the cold trap 24 with a purified cold water flowing therethrough. The cold trap 24 may be observed through a view port 42 such that an operator may visually examine the interior wall of the conduit 14 for contaminant deposits. The second gate valve 28 may be bypassed by the pneumatic valve 30 between two flange connectors 44 and 46.

It should be noted that the second gate valve 28 is only required in certain applications. While the combination of a first gate valve 20 and the cold trap 24 may be adequate in applications where large contaminating particles are eliminated by the trap.

When a single gate valve 20 is utilized, the pressure in the process chamber and in the conduit before the first gate valve is about 1~120 Pa, while the pressure in the dry pump 16 and in the conduit 14 is about 1 atm (or $10^5$ Pa). When two gate valves are utilized in the present invention method, the pressure in the process chamber remains at between 1~120 Pa, the pressure in the middle section 36 of the conduit 14 may be between 1 Pa and $10^5$ Pa when compared to the atmospheric pressure existed in the pump 16.

The effectiveness of the present invention novel method is further illustrated by Table 1 which shows the particle status in he process chamber a Table 1

| TEOS Oxide | Particles added (0.15 μm) | | |
|---|---|---|---|
| Date | Upper | Center | Lower |
| 11/4 | 73 | 42 | 34 |
| 11/9 | 65 | 48 | 38 |

Data shown in Table 1 were obtained in a vertical furnace which holds six batches of wafers, or a total of 144 wafers.

In the Table, the particle counts at an upper section, at a center section and at a lower section are shown for two different dates. When these numbers, i.e., between 34 and 73, are compared to those obtained in a conventional deposition method, i.e., about 1500, the effectiveness of the present invention novel method and apparatus is self evident.

Figure 4:
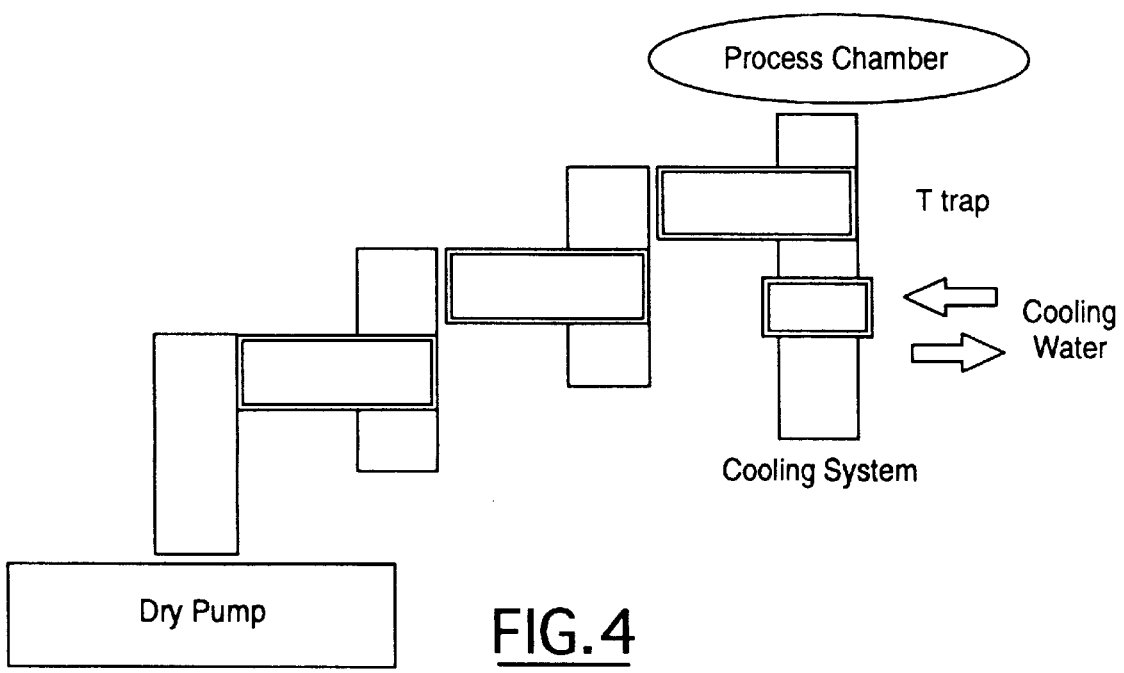
FIG. 4 is an illustration of an alternate embodiment wherein multiple numbers of T-shaped traps are connected in series.

In another alternate embodiment as shown in FIG. 4, more than one T-shaped cold trap may be used in the present invention apparatus. These T-traps should be connected in series. The number of T-traps used may be limited since the pumping speed normally decreases with increasing number of turns in the conduit. The configuration shown in FIG. 4 is therefore used only when necessary, such as in a situation where very large number of contaminating particles are generated.

The present invention novel method and apparatus for venting a process chamber by a dry pump have therefore been amply demonstrated by the above descriptions and by the appended drawings of FIGS. 1–4. It should be noted that while the apparatus and method have been illustrated by using a TEOS oxide deposition process as an example, the apparatus and method can be utilized for any other semiconductor processing as long as the deposition process produces by-products, or contaminating particles.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for preventing chamber contamination by particles from a conduit or a pump comprising the steps of:
   providing a conduit having at least one 90° bend for fluid communication between a process chamber and a pump,
   installing a first gate valve in said conduit juxtaposed to said process chamber, and
   installing a T-shaped cold trap in said conduit at said at least one 90° bend in between said gate valve and said pump,
   whereby said first gate valve and said T-shaped cold trap substantially prevents particle contamination to said process chamber upon failure of said pump.

2. A method for preventing chamber contamination by particles from a conduit or apump according to claim 1 further comprising the step of installing a second gate valve in said conduit juxtaposed to said pump.

3. A method for preventing chamber contamination by particles from a conduit or a pump according to claim 1 further comprising the step of installing a second gate valve in said conduit in close proximity to said pump.

4. A method for preventing chamber contamination by particles from a conduit or a pump according to claim 3, wherein said first gate valve is installed in said conduit in close proximily to said process chamber.

5. A method for preventing chamber contamination by particles from a conduit or a pump according to claim 1 further comprising the step of installing a pneumatic valve bypassing said second gate valve, said pneumatic valve having a fluid passage smaller than a passage in said conduit.

6. A method for preventing chamber contamination by particles from a conduit or a pump according to claim 1 further comprising the steps of:
   bypassing said second gate valve with a third valve which has a substantially smaller passage than a passage in said second gate valve, and
   evacuating said process chamber through said third valve for preventing overloading of said pump at the start of an evacuation sequence.

7. An apparatus for evacuating a semiconductor process chamber comprising:
   a conduit providing fluid communication between a semiconductor process chamber and a dry pump, said conduit having at least one 90° bend,
   a gate valve for opening and closing said conduit situated juxtaposed to said semiconductor process chamber, and
   a T-shaped particle trap positioned at said at least one 90° bend of said conduit in fluid communication with said gate valve and said dry pump for collecting particles in said conduit.

8. An apparatus for evacuating a semiconductor process chamber according to claim 7, wherein said T-shaped particle trap is a cold trap.

9. An apparatus for evacuating a semiconductor process chamber according to claim 7 further comprising a second gate valve for opening and closing said conduit situated juxtaposed to said dry pump.

10. An apparatus for evacuating a semiconductor process chamber according to claim 7, wherein said gate valve is situated immediately adjacent to said semiconductor process chamber.

11. An apparatus for evacuating a semiconductor process chamber according to claim 7, wherein a first pressure in said semiconductor process chamber is about $1.2 \times 10^2$ Pa and a second pressure in said dry pump is about $10^5$ Pa.

12. An apparatus for evacuating a semiconductor process chamber according to claim 7 further comprising a second T-shaped particle trap connected in series with said T-shaped particle trap.

13. An apparatus for evacuating a semiconductor process chamber according to claim 7, wherein said T-shaped particle trap substantially prevents particle contamination to said semiconductor process chamber by reducing number of particles deposited in said conduit.

14. An apparatus for evacuating a semiconductor process chamber according to claim 7, wherein said gate valve and said T-shaped particle trap substantially prevent particle contamination to said semiconductor process chamber upon failure of said dry pump.

15. An apparatus for providing fluid communication between a process chamber and a dry pump comprising:
   a conduit member connecting said process chamber and said dry pump and providing fluid communication thereinbetween, said conduit having at least one 90° bend,
   a first gate valve in said conduit positioned juxtaposed to said process chamber,
   a T-shaped cold trap situated at said at least one 90° bend of said conduit in between and in fluid communication with said first gate valve and a second gate valve, and
   a second gate valve in said conduit positioned juxtaposed to said dry pump.

16. An apparatus for providing fluid communication between a process chamber and a dry pump according to claim 9, wherein said first gate valve is positioned in close proximity to said process chamber and said second gate valve is positioned in close proximity to said dry pump.

17. An apparatus for providing fluid communication between a process chamber and a dry pump according to claim 15 further comprising a pneumatic valve for bypassing said second gate valve, said pneumatic valve having a fluid passage substantially smaller than a passage in said conduit member for preventing overloading of said dry pump at the beginning of a pumping sequence.

18. An apparatus for providing fluid communication between a process chamber and a dry pump according to claim 15 further comprising a second T-shaped cold trap connected in series with said T-shaped cold trap.

19. An apparatus for providing fluid communication between a process chamber and a dry pump according to claim 15, wherein a first pressure in said process chamber is about $1.2 \times 10^2$ Pa and a second pressure in said dry pump is about $10^5$ Pa.

20. An apparatus for providing fluid communication between a process chamber and a dry pump according to claim 15, where in said first gate valve, said T-shaped cold trap and said second gate valve substantially prevent particle contamination to said process chamber upon failure of said dry pump.

* * * * *